United States Patent [19]

Grossa

[11] Patent Number: 4,698,293

[45] Date of Patent: Oct. 6, 1987

[54] PROCESS FOR FORMING POSITIVE TONABLE IMAGES USING A PHOTOSENSITIVE MATERIAL CONTAINING AT LEAST 1,4-DIHYDROPYRIDINE

[75] Inventor: Mario Grossa, Dreieich, Fed. Rep. of Germany

[73] Assignee: E. I. Du Pont de Nemours and Company, Wilminton, Del.

[21] Appl. No.: 929,376

[22] Filed: Nov. 12, 1986

[30] Foreign Application Priority Data

Nov. 16, 1985 [DE] Fed. Rep. of Germany ....... 3540796

[51] Int. Cl.$^4$ .............................................. G03C 5/00
[52] U.S. Cl. .................................. 430/291; 430/270; 430/326; 430/328
[58] Field of Search ................ 430/328, 291, 270, 326

[56] References Cited

U.S. PATENT DOCUMENTS

| | | | |
|---|---|---|---|
| 3,888,672 | 6/1975 | Lee | 430/292 |
| 4,243,741 | 1/1981 | Abele et al. | 430/270 |
| 4,346,162 | 8/1982 | Abele et al. | 430/270 |
| 4,604,340 | 8/1986 | Grossa | 430/270 |

*Primary Examiner*—Jack P. Brammer

[57] ABSTRACT

A process for the production of patterns that consist of powders and that are positive with respect to the original is described, according to which a light-sensitive layer containing at least one 1,4-dihydropyridine compound is exposed imagewise, treated with a strong acid, post-exposed diffusely to produce tacky areas, and is subsequently toned.

12 Claims, No Drawings

PROCESS FOR FORMING POSITIVE TONABLE IMAGES USING A PHOTOSENSITIVE MATERIAL CONTAINING AT LEAST 1,4-DIHYDROPYRIDINE

The invention relates to a process for the production of patterns that consist of powders and that are positive with respect to the original, using a light-sensitive layer containing at least one 1,4-dihydropyridine compound.

Reproduction processes are known in which differences in the tackiness of the exposed and unexposed areas of the light-sensitive layer are used to produce the image. Thus, e.g., a reproduction process is known from U.S. Pat. Nos. 3,060,024, 3,620,726, and 3,582,327, in which a tacky photopolymerizable reproduction material is hardened by imagewise exposure, whereby the exposed image areas lose their tackiness. The image is then made visible by dusting it with suitable toners that only adhere to the unexposed tacky places, while they can be removed from the exposed non-tacky image areas after the dusting. A positive image of the original is obtained by this process.

Negative working tonable light-sensitive reproduction materials are likewise known. Because of their favorable properties, especially their insensitivity to oxygen and their good toning behavior, materials that contain at least one light-sensitive 1,4-dihydropyridine compound have given particularly good results in practice. Such materials are described, e.g., in U.S. Pat. Nos. 4,243,741, 4,346,162, and 4,604,340, and are preferred to carry out color proofing processes, to produce printed circuits, to produce images on ceramic articles, and to produce phosphor screens for cathode ray tubes. For a number of applications, however, e.g., to produce a black matrix for dot or strip phosphor patterns, or to produce complex circuits of etched or galvanized and toned elements, there is a need for a process that makes it possible to produce patterns positive with respect to the original in a simple manner using these reproduction materials.

It was therefore the object of the present invention to give a process for the production of patterns that consist of powders and that are positive with respect to the original, using a light-sensitive layer containing at least one 1,4-dihydropyridine compound.

This object was achieved by a process according to which a negative working tonable light-sensitive layer that contains at least one 1,4-dihydropyridine compound is applied onto a substrate, is exposed imagewise, the tacky photoreaction products formed during the exposure are converted into non-tacky products by treating them with a strong, inorganic or organic acid having a pKa value $\leq 2.0$, and subsequently tackiness is produced in the non-imagewise exposed areas by means of a non-imagewise exposure or heating and these tacky areas are toned by applying a finely-divided powder, to produce patterns consisting of powders which are positive with respect to the original.

The starting point for the invention is the recognition that an image reversal is possible by converting the tacky photoreaction products into non-tacky compounds.

Suitable strong acids to carry out the reversal process are, e.g.: HCl, HBr, HNO$_3$, H$_2$SO$_4$, p-toluene sulfonic acid, and amido sulfonic acid, with the volatile acids having given particularly good results.

The reversal can be carried out in different ways. According to a preferred form of embodiment, the imagewise exposed material is subjected to the vapor of the acid. In practice, for example, the imagewise exposed layer situated on a substrate is inserted into a chamber that has been charged with anhydrous or hydrous acid vapor or an air mixture containing acid vapor.

According to a particularly preferred method, the atmosphere in the chamber is saturated with the vapor of a 25 wt.-% solution of hydrochloric acid at 25° C. The duration of the acid treatment is governed by the thickness of the light-sensitive layer and is, e.g., about 30–60 seconds for a 1 μm thick layer. After the acid treatment, any excess can be removed by blowing it off in an air current at 18°–40° C.

The treatment can also be carried out with the aqueous solutions of the acids, whose concentration is preferably between 0.5 and 5 wt.-%. The treatment in this case can be carried out in a simple manner by immersing the imagewise exposed material in the aqueous solution and subsequently rinsing it with water. Depending on the degree of exposure, the type of binders used, and the mechanical stressing of the layer, this can lead to washing off exposed areas.

According to another form of embodiment, the treatment can also take place by applying finely-divided powders which are charged with the strong acid and which serve as a carrier material. Powders suitable as a carrier material are natural or synthetic polymers, e.g., polyamides, polyalkylene oxides, polyvinyl alcohol, polyvinylpyrrolidone, polyacrylates such as, e.g., polyacrylmethacrylate and copolymers of acrylic acid and maleic acid anhydride. Kaolin, SiO$_2$, CaSO$_4$, Al$_2$O$_3$, and the like are also suitable.

The charging of the carrier material with acid is done preferably by mixing the carrier material with the aqueous acid, with the mixture ratios being selected such that the flowability of the powder is maintained.

According to the described process, positive patterns of powdery materials that excel in their high density of toner and high contrast, are obtained. Among the known negative-working tonable reproduction materials containing at least one 1,4-dihydropyridine compound, those containing 1,4-dihydropyridines substituted in the 4-position by a 2'-nitrophenyl ring have proven to be especially suitable to carry out the present process. Preferred compounds correspond to the following formula:

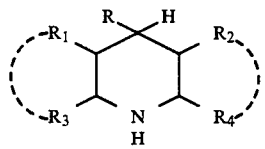

in which:

R: denotes 2'-nitrophenyl, whereby the phenyl radical can be substituted by C$_1$ to C$_4$ alkyl— or oxalkyl—, OH—, halogen—, NH$_2$—groups R$_1$ and/or R$_2$: denote CN, COOR' or COR', whereby R' represents an alkyl group having 1–11 carbon atoms, which can also be substituted with —OCH$_3$ or —OC$_2$H$_5$, and whereby R$_1$ and R$_2$ can be the same or different.

R$_3$ and R$_4$: denote C$_1$ to C$_4$ alkyl, whereby R$_3$ and R$_4$ can be the same or different.

$R_1$ and $R_3$ and/or $R_2$ and $R_4$: denote the atoms required to complete a 5- or 6-membered carbocyclic or heterocyclic ring containing a carbonyl group.

Further suitable compounds can be taken from applicant's U.S. Pat. No. 4,604,340, issued Aug. 5, 1986, the teaching of which is incorporated herein by reference.

Another light-sensitive system consisting of at least one 1,4-dihydropyridine compound and one hexaarylbisimidazole compound is described in U.S. Pat. No. 4,243,741, issued Jan. 6, 1981, the teaching of which is hereby incorporated by reference. Suitable dihydropyridine compounds can be seen from Table 1 of that patent. Examples that should be named are: 2,4,6-trimethyl-3,5-bis-(carbethoxy)-1,4-dihydropyridine; 2,6-dimethyl-4-ethyl-3,5-bis(carbethoxy)-1,4-dihydropyridine; 2,6-dimethyl-4-n-propyl-3,5-bis(carbethoxy)-1,4-dihydropyridine; and 2,6-dimethyl-4-benzyl-3,5-biscarbethoxy)-1,4-dihydropyridine.

Suitable hexaarylbisimidazole compounds, the second component of the light-sensitive system, are summarized in Table 2 of the above patent. The following are particularly preferred: 2,2',4,4',5,5'-hexaphenyl biimidazole; 2,2'-bis(2-chlorophenyl)-4,4',5,5'-tetrakis(3-methoxyphenyl)biimidazole; and 2,2'-bis(2-methoxyphenyl)-4,4',5,5'-tetraphenyl biimidazole.

The light-sensitive compounds can be applied on the substrate alone or mixed together or jointly with a binder according to known methods. Preferred layer thicknesses are between 0.5 and 5 μm.

Suitable binders are polyacrylic acid esters or polymethacrylic acid esters and their copolymers with acrylic or methacrylic acid or other acryl- or vinyl monomers; copolymers of maleic acid anhydride, of maleic acid, and/or its di- or semiesters with styrene, or other vinyl monomers; chlorine-containing vinyl polymers or copolymers such as, e.g., polyvinyl chloride and its polychlorination products, polyvinylidene chloride, chlorinated polyethylene, etc.; polystyrene and polystyrene copolymers, ethylene and ethylene copolymers, e.g., with maleic acid, etc.; synthetic rubber types based on butadiene, chloroprene, etc., and their copolymers, e.g., with styrene and acrylonitrile; polyethers such as, e.g., polyethylene oxides of high molecular weight or polyepichlorohydrin.

The layers can optionally contain other additives such as, e.g., sensitizers, plasticizers, stabilizers, optical brighteners, matting agents, coating agents, or others. Among others, benzophenone, Michler's ketone, or 7-(N,N-diethylamino)-4-methyl-cumarin have proven particularly useful as sensitizers.

A large number of transparent or opaque materials are suitable as supports for the light-sensitive layer. Examples are: papers, optionally baryta-coated; cardboard; metal foils, e.g., of aluminum, copper, steel, etc.; wood; glass; porcelain; ceramics; films or non-wovens of natural or synthetic polymers.

Further layers, e.g., substrata, can also be present on the layer support if required. A special protective film over the light-sensitive layer, which would have to be peeled off before the toning process, is not necessary in principle. If desired, however, it can be applied to avoid damage to the light-sensitive layer.

The imagewise exposure of the material is carried out with ultraviolet light. A wavelength range of 300–400 nm is preferred. Suitable sources of irradiation that deliver an effective amount of this irradiation, are, e.g., xenon lamps, mercury vapor lamps, and fluorescent lamps. Depending on the sensitivity of the light-sensitive material and the distance from and type and intensity of the light source used, exposure times are between 5 and 100 seconds.

The diffuse (i.e., non-imagewise) post-exposure is likewise carried out using the above-named light sources. The desired toner coverage or density can be achieved by regulating the intensity and duration of exposure. In general, the post-exposure is 20% shorter than the imagewise exposure.

To carry out the heat treatment, the material is generally brought to a temperature about 30° C. above the glass transition temperature of the respective light-sensitive material in a per se known manner. The tack temperature for a particular light-sensitive composition can easily be determined empirically from case to case, however, by those skilled in the art.

Following the diffuse post-exposure or the heat treatment, the tacky areas produced, which represent a positive image of the original, are toned with a suitable toner in order to reproduce the desired color.

The toner can be applied onto the exposed layer either manually, e.g., using a cotton pad, or by using special applicators or application apparatus. Suitable methods are known to those skilled in the art.

Finely-divided powder toners of very varied composition can be used to tone the exposed areas. For example, inorganic or organic pigments, phosphors, metal powders, or soluble organic dyes in pure form or on a powdery organic or inorganic carrier, are suitable.

The described reversal process can be used with particular advantage to produce a black matrix for the fluorescent screen of a color picture tube. To improve the contrast, it is known to use multiple screens in which the spaces between the individual color patterns are filled or coated with a light-absorbing material. In practice, such an image screen is usually manufactured by producing the black matrix in a first step and subsequently producing the colored elements of the image in a second process step.

The process of the invention is described below, using as an example the production of a black matrix for a television screen.

The image screen provided on the inside with the light-sensitive layer is exposed on a conventional television exposure table through a shadow mask with circular holes in the different positions of the three basic colors, to produce the matrix pattern. Then the image screen is subjected to the acid treatment, is post-exposed diffusely or heated, and is toned with a black pigment powder. A positive image corresponding to the circular shadow mask is obtained, i.e., the spaces between the phosphor dots that are to be applied later, are toned black.

The process of the invention, for the production of positive patterns that are positive with respect to the original and consist of powders, excels above all in that the light-sensitive materials used to carry it out, in contrast to the conventional materials based on photopolymerization, are insensitive to oxygen; i.e., they do not require any particular protective measures such as cover layers, conditioning, or a protective gas atmosphere during the exposure. For practical use, it is a decisive advantage that the materials can be used in thin layers without hindrance by atmospheric oxygen.

It is further advantageous that the light-sensitive starting materials are not tacky, which considerably facilitates their handling. A further advantage is that patterns that are either positive or negative to the original and that consist of powders can be produced in a simple manner using the same light-sensitive material.

Moreover, the tonable density can be adjusted as desired by altering the diffuse post-exposure, without impairing the regulated imagewise contrast or the resolution.

The following examples are intended to illustrate the invention. All percentages given are percentages by weight.

EXAMPLE 1

A solution of 7.5 g of dimethylester of 2,6-dimethyl-4-(2'-nitrophenyl)-1,4-dihydropyridine-3,5-dicarboxylic acid, and 7.5 g of diethylester of 2,6-dimethyl-4-(2'-nitrophenyl)-1,4-dihydropyridine-3,5-dicarboxylic acid in 200 mL of methylethylketone is applied on 2 glass plates A and B. After drying, the layer thickness is 1.2 $\mu$m. Both plates are exposed behind a line original for 60 seconds with a 1000 W mercury vapor lamp at a distance of 40 cm. Plate A is exposed to the vapor of a 25% aqueous hydrochloric acid for 30 seconds, is blown off with air, is exposed diffusely for 30 seconds, and is toned with a red pigment powder.

Plate B is immersed after exposure in a mixture of 90 mL of 3% aqueous hydrochloric acid and 10 mL of ethanol for 1 minute, rinsed with water, and dried. Then the plate is likewise exposed diffusely for 30 seconds and is toned with a red pigment powder. In both cases a positive image of the original is obtained.

EXAMPLE 2

A solution of 7.0 g of dimethylester of 2,6-dimethyl-4-(2'-nitrophenyl)-1,4-dihydropyridine-3,5-dicarboxylic acid, and 7.0 g of diethylester of 2,6-dimethyl-4-(2'-nitrophenyl)-1,4-dihydropyridine-3,5-dicarboxylic acid in 150 mL of methylethylketone is applied onto a glass plate so that the layer thickness after drying is 0.9 $\mu$m. The glass plate is then exposed through a 3$\sqrt{2}$ step wedge for 40 seconds with a light source equipped with UV-emitting fluorescent tubes (light output 5 mW/cm$^2$).

The plate is then exposed to the vapor of a 60% aqueous hydrobromic acid for 30 seconds and is blown off with 40° C. air. It is then post-exposed diffusely for 40 seconds using the above-named light source, and is subsequently toned with a blue pigment powder. A positive image of the wedge original is formed.

EXAMPLE 3

A solution of 7.0 g of diethylester of 2,6-dimethyl-4-(2'-nitrophenyl)-1,4-dihydropyridine-3,5-dicarboxylic acid in 100 mL of methylethylketone is applied onto a 10×4 cm copper plate so that the layer thickness after drying is 1.0 $\mu$m. It is then exposed through a line original for 30 seconds as in Example 2, and the exposed plate is shaken in a container with 30 g of a powder produced by mixing 1 part by weight of 17% aqueous hydrochloric acid and 3 parts by weight of precipitated silicic acid. After the powder has been blown off, the plate is toned with a blue pigment powder at a temperature of 30° C. A positive image of the original is obtained.

EXAMPLE 4

A solution of 5 g of di-($\beta$-methoxyethyl)-ester of 2,6-dimethyl-4-(2'-nitro-, 4',5',-dimethoxyphenyl)-1,4-dihydropyridine-3,5-dicarboxylic acid in 100 mL of methylethylketone is applied onto a glass plate so that the layer thickness after drying is 0.9 $\mu$m. It is then exposed for 60 seconds through a 3$\sqrt{2}$ step wedge with a 1000 W mercury vapor lamp at a distance of 40 cm and is subsequently shaken for 30 seconds with a powder mixture produced from 5 g of precipitated silicic acid (average agglomerate size 40 $\mu$m) and 6 mL of 18% aqueous hydrobromic acid, and the powder is blown off with air.

The area exposed through the step wedge is then exposed diffusely for 40 seconds using the above-described light source, and is toned with a blue pigment powder. A positive image of the wedge is obtained.

EXAMPLE 5

A solution of 5.0 g of diethylester of 2,6-dimethyl-4-(2'-nitrophenyl)-1,4-dihydropyridine-3,5-dicarboxylic acid in 60 mL of methylethylketone is applied onto the inside of the screen of a color image tube by centrifuging, so that the thickness of the dried layer is 0.8 $\mu$m. The screen is then exposed through a slitted shadow mask in each position of the three basic colors, on a conventional television exposure table and using a 1000 W mercury vapor lamp. The distance between the lamp and the screen is 22 cm, and the duration of exposure is 60 seconds. After the shadow mask has been removed, the light-sensitive layer is (a) treated with a 3% aqueous hydrochloric acid and rinsed with water, or (b) exposed for 4 minutes to the vapor of a 20% aqueous hydrochloric acid and is blown dry. Then it is exposed diffusely, i.e., without a shadow mask, for 30 seconds using the above-named light source, and is toned with a black iron oxide powder. In both cases a positive image corresponding to the shadow mask is obtained that is outstandingly suitable as a matrix for a television screen.

EXAMPLE 6

A solution of 3.0 g of dimethylester of 2,4,6-trimethyl-1,4-dihydropyridine-3,5-dicarboxylic acid 3.0 g of dimethylester of 2,6-dimethyl-4-ethyl-1,4-dihydropyridine-3,5-dicarboxylic acid.

3.0 g of dimethylester of 2,6-dimethyl-4-isopropyl-1,4-dihydropyridine-3,5-dicarboxylic acid 7.5 g of 2,2'-bis(2-chlorophenyl)-4,4',5,5'-tetrakis(3-methoxyphenyl)biimidazole 14.0 g of 2,2'-bis(2-ethoxyphenyl)-4,4',5,5'-(3-methoxyphenyl)biimidazole 4.0 g of polystyrene 20.0 g of copolymer of methylacrylate and butylacrylate (proportion 10/90; Tg$\approx$4° C.).

in 250 mL of methylene chloride is applied onto a 100 $\mu$m thick polyester support so that the layer thickness after drying is 7 $\mu$m. The material is exposed behind a line original for 2 minutes with a 1000 W mercury vapor lamp at a distance of 40 cm and is subsequently immersed in a solution of (a) 3.0 g of amido sulfonic acid in 100 mL of water or (b) 3.0 g of p-toluene sulfonic acid in 100 mL of water for 5 minutes, is rinsed with water, dried, diffusely post-exposed for 90 seconds with the above-named light source, and is toned with graphite powder. In both cases a positive image of the original is formed.

EXAMPLE 7

A solution of 3.0 g of diethylester of 2,6-dimethyl-4-methyl-1,4-dihydropyridine-3,5-dicarboxylic acid 3.0 g of diethylester of 2,6-dimethyl-4-ethyl-1,4-dihydropyridine-3,5-dicarboxylic acid.

3.0 g of diethylester of 2,6-dimethyl-4-isopropyl-1,4-dihydropyridine-3,5-dicarboxylic acid, and 4.0 g of 2,2'-bis(2-chlorophenyl)-4,4',5,5'-tetrakis(3-methoxyphenyl)-biimidazole 2.0 g of copolymer of methylacrylate and ethylacrylate ($Tg \approx 40°$ C.)

in 150 mL of methylethylketone is coated onto a polyester layer support so that the thickness of the dried layer is 1.5 μm. The material is then exposed behind a line original for 90 seconds with a 1000 W mercury vapor lamp at a distance of 40 cm. Then the material is immersed for 2 minutes in 1% aqueous sulfuric acid, rinsed with water, dried, post-exposed diffusely for 90 seconds with the above-named light source, and is toned with graphite powder. A positive image of the original is formed.

I claim:

1. Process for the production of powder images that are positive with respect to an original on at least one side of a substrate bearing, on at least one side, a layer of a light-sensitive composition that contains at least one 4-(2'-nitrophenyl)-1,4-dihydropyridine compound, and/or at least one 1,4-dihydropyridine compound and at least one hexaarylbisimidazole compound, comprising, in the stated order the steps of:

(a) exposing said light-sensitive layer imagewise to actinic radiation to produce tacky image areas;

(b) treating the light-sensitive layer with a strong inorganic or organic acid having a pKa value $\leq 2.0$;

(c) exposing non-imagewise to actinic radiation or heating to produce tackiness in the areas not exposed to actinic radiation in step (a); and (d) toning of the tacky areas with finely-divided powders.

2. Process according to claim 1, wherein in step (b) the light-sensitive layer is treated with a strong volatile acid.

3. Process according to claim 1, wherein in step (b) the light-sensitive layer is treated with hydrochloric acid.

4. Process according to claim 2, wherein the strong volatile acid is hydrochloric acid.

5. Process according to claim 1, wherein in step (b) the light-sensitive layer is treated with the vapor of a strong volatile acid.

6. Process according to claim 2, wherein the light-sensitive layer is treated with the vapor of the strong volatile acid.

7. Process according to claim 3, wherein the the light-sensitive layer is treated with the vapor of hydrochloric acid.

8. Process according to claim 1, wherein in step (b) the light-sensitive layer is treated with a finely-divided carrier material charged with the strong acid.

9. Process according to claim 2, wherein the light-sensitive layer is treated with a finely-divided carrier material charged with the strong volatile acid.

10. Process according to claim 3, wherein the light-sensitive layer is treated with a finely-divided carrier material charged with hydrochloric acid.

11. Process according to claim 1, wherein in step (b) the light-sensitive layer is treated with a finely-divided silicic acid charged with hydrochloric acid.

12. Process according to claim 8, wherein the light-sensitive layer is treated with a finely-divided silicic acid charged with hydrochloric acid.

* * * * *